(12) United States Patent
Kenington

(10) Patent No.: US 6,844,793 B2
(45) Date of Patent: Jan. 18, 2005

(54) SIGNAL COMBINER, A SIGNAL SPLITTER AND A CIRCUIT USING A COMBINER AND A SPLITTER

(75) Inventor: Peter Kenington, Chepstow (GB)

(73) Assignee: Andrew Corporation, Orland Park, IL (US)

( * ) Notice: Subject to any disclaimer, the term of this patent is extended or adjusted under 35 U.S.C. 154(b) by 99 days.

(21) Appl. No.: 10/204,992

(22) PCT Filed: Feb. 7, 2001

(86) PCT No.: PCT/GB01/00481

§ 371 (c)(1),
(2), (4) Date: Oct. 21, 2002

(87) PCT Pub. No.: WO01/63756

PCT Pub. Date: Aug. 30, 2001

(65) Prior Publication Data

US 2003/0107453 A1 Jun. 12, 2003

(30) Foreign Application Priority Data

Feb. 24, 2000 (GB) .............................. 0004421

(51) Int. Cl.$^7$ ................................................ H01P 1/10
(52) U.S. Cl. ...................... 333/101; 333/104; 333/125; 333/127
(58) Field of Search ................................. 333/101, 104, 333/125, 127

(56) References Cited

U.S. PATENT DOCUMENTS

| | | | |
|---|---|---|---|
| 4,780,685 A | 10/1988 | Ferguson | |
| 4,893,093 A | 1/1990 | Cronauer et al. | |
| 4,965,530 A | 10/1990 | Katz | |
| 5,111,166 A | 5/1992 | Plonka et al. | |
| 5,274,343 A | * 12/1993 | Russell et al. | 333/103 |
| 5,767,755 A | 6/1998 | Kim et al. | |
| 5,783,975 A | * 7/1998 | Nakamura | 333/101 |
| 5,821,811 A | 10/1998 | Persson | |
| 5,872,491 A | 2/1999 | Kim et al. | |
| 6,097,266 A | * 8/2000 | Nardozza et al. | 333/101 |
| 6,323,742 B1 | * 11/2001 | Ke | 333/127 |

* cited by examiner

Primary Examiner—Benny Lee
Assistant Examiner—Kimberly E Glenn
(74) Attorney, Agent, or Firm—Steve Mendelsohn

(57) ABSTRACT

A circuit is provided where impedance converters (41–48) are provided such that active components (P1 to P8) can be switched off without power from the other active components leaking away through those components which are switched off.

17 Claims, 1 Drawing Sheet

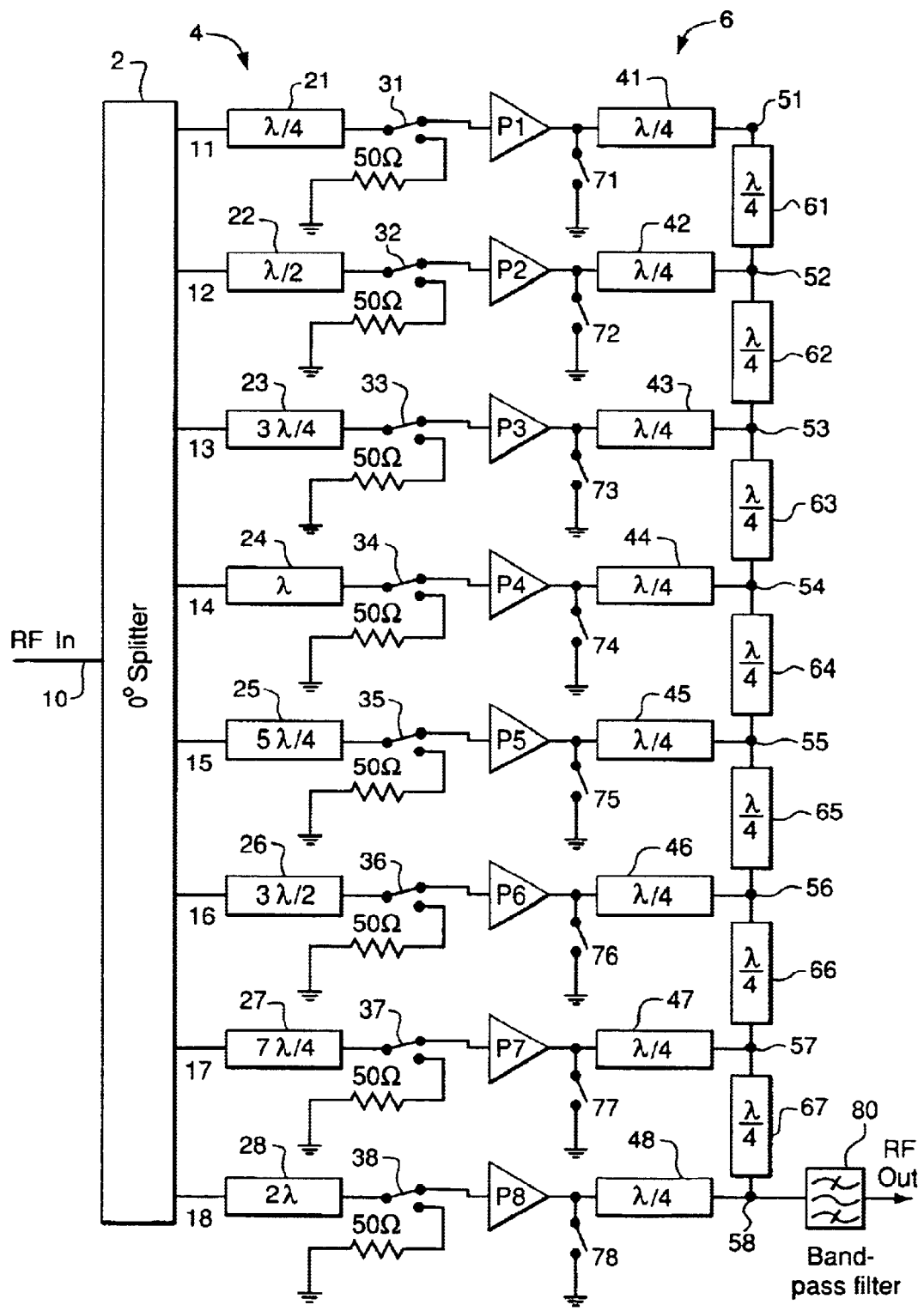

SIGNAL COMBINER, A SIGNAL SPLITTER AND A CIRCUIT USING A COMBINER AND A SPLITTER

FIELD OF THE INVENTION

The present invention relates to a signal combiner, a signal splitter and to a circuit using these components.

BACKGROUND OF THE INVENTION

It is known to combine the outputs of a number of devices, such as high power amplifiers. This can be advantageous as it may deliver a method of obtaining higher output powers than might otherwise conveniently be obtainable, for example in a radio base station, or it may enable efficiencies of amplifiers to be increased by running a plurality of amplifiers of different power outputs in combination in order to achieve a desired power output. There may also be other instances in which it is desirable to combine the outputs of electronic devices.

Combiners are known. For example a Wilkinson Combiner System will work acceptably to combine the outputs of a plurality of amplifiers provided that all of the amplifiers are operating. However, should one amplifier fail, then the loss of output power is many times greater than the original contribution of that amplifier. This is due to the fact that not only is the contribution from that amplifier lost, but the amplifier can now become a load and the power from the other amplifiers is now wasted as it flows through the output impedance of the amplifier plus the balancing loads present as part of the combiner. The balancing loads therefore need to be adequately rated to cope with the possibility of amplifier failure and hence can become very large, possibly needing to be rated at several hundred watts in some cases.

SUMMARY OF THE INVENTION

According to a first aspect of the present invention, there is provided a signal combiner having a plurality of signal input paths, wherein each signal path comprises an input impedance transforming device and switching means for selectively connecting the input of the impedance transforming device to a predetermined impedance, the output of the impedance transforming devices being connected together in a summing configuration.

By providing an input impedance transforming device, the effect of failure of a device connected to an input of the signal combiner can be reduced or alleviated.

Advantageously the switching means associated with one or more of the impedance transforming devices is arranged to connect the input of the associated impedance transforming device to ground. The advantage of this is that a switching mean does not have to be rated to handle the full amount of power which might be provided to the signal input path. For example, if the combiner was used to combine the outputs of several RF amplifiers, each rated at several hundred watts, the switch itself is not involved in connecting the output of the amplifier to an input of the signal combiner, and therefore does not have to be rated to handle several hundred watts of power and neither can it degrade the signal path. The switch merely serves to ground the input of the impedance transforming device when the amplifier is switched off or in a fault mode.

Preferably the or each impedance transforming device is implemented using a transmission line.

When the input of the impedance transforming device, formed from a transmission line, is shorted to ground, the transmission line becomes mismatched. This mismatch causes the impedance presented at the output of the transmission line to be transformed. Thus for a circuit having a nominal centre operating frequency $F_0$ having an electrical wavelength $\delta$, the impedance presented by the output of a transmission line having a characteristic impedance $Z_0$ and a length $$\frac{\lambda}{4}$$

is given by:

$$Z_{out} = Z_0^2 \div Z_{load}$$

When the input of the transmission line is shorted to ground, the impedance at its output rises to infinity for the ideal (loss less) transmission line.

For a combiner having N input channels, and consequently N impedance converters, each nth converter, where n is a integer in the range 1–N, has a output connected to a nth node, and the nth node is connected to the (n−1)th node by an (n−1)th linking element.

Advantageously each linking element is also a transmission line. Transmission lines of an odd number of ¼ wavelengths, ie $$\frac{\lambda}{4}, \frac{3\lambda}{4}, \frac{5\lambda}{4}$$

and so on are preferred.

According to a second aspect of the invention, there is provided a device comprising plurality of channels, and a combiner according to the first aspect of the present invention.

Advantageously the electronic device further comprises a splitter and a plurality of signal processing devices. As used herein the term signal processing device is intended to include a device which changes the frequency, amplitude or phase of a signal passing therethrough. Advantageously the signal processing devices are active devices, such as amplifiers.

Advantageously the splitter has a plurality of outputs. An input signal to the splitter may be divided equally amongst the outputs. Advantageously each of the outputs is in phase with each other.

Preferably the splitter has N outputs and the phase difference between an nth and an (n−1)th output is $$\frac{\lambda}{4},$$

where n is a positive non zero integer in the range 1 to N. Advantageously the delay applied to the nth output is $$\frac{(n\lambda)}{4}.$$

Advantageously the output of each channel can be selectively connected to the signal processing device, which signal processing device presents a matched load, or to a terminating load. Thus the active signal processing device can be switched out of the channel without its removal causing substantial changes to the performance of any other of the channels, as the terminating load prevents reflections.

In an arrangement where the active devices are amplifiers, the combined electronic device which has a plurality of amplifier channels can be left operating whilst a amplifier in any one channel is switched off for maintenance or removal, thereby giving rise to a circuit which allows "hot swapping" of active components.

According to a third aspect of the present invention, there is provided a combined splitter and phase compensation device for use in combination with the combiner according to the first aspect of the present invention, wherein the combined splitter and phase compensation device has N output channels and the phase difference between a nth channel and an (n−1)th channel of the splitter and phase compensator matches he path length difference between a nth channel and an (n−1)th channel of the combiner, where n is an integer in the range 1 to N.

BRIEF DESCRIPTION OF THE DRAWINGS

The present invention will further be described, by way of example, with reference to the accompanying FIGURE which discloses the multi-channel amplifier constituting an embodiment of the present invention.

DETAILED DESCRIPTION

The arrangement shown in the accompanying FIGURE comprises a eight way 0° splitter 2, a phase compensation section indicated generally as 4, eight power amplifiers P1 to P8 and an eight way combiner indicated generally as 6. The circuit is designed to amplify an RF input having a carrier frequency $F_0$ which has a wave length $\delta_0$ in a transmission line. The splitter 2 accepts an RF signal at its input 10 and splits this equally in amplitude and without introducing phase shifts between its eight outputs 11 to 18. The first output is connected to a first delay line 21 introducing a phase delay of $$\frac{\lambda}{4}.$$

The second output 12 is connected to a delay line 22 introducing an delay of $$\frac{2\lambda}{4}.$$

The third output 23 is connected to a third delay line 23 introducing a delay of $$\frac{3\lambda}{4},$$

and so on up to the 8th output which is connected to a delay line 28 introducing a delay of $$\frac{8\lambda}{4}.$$

The output of each delay line can then be connected to an associated amplifier via a switch. Thus the output of the first delay line 21 can be connected to the input of amplifier P1 via a switch 31. Similarly the output of the second delay line 22 is connected to the amplifier P2 via a second switch 32, and so on for each channel. Each of the switches 31 to 38 is a two position switch, such that if the delay line is not connected to the associated amplifier, then the output of the delay line is connected to ground via a terminating load having the same characteristic impedance as the transmission lines used to form the delay lines.

The output of each of the amplifiers P1 to P8 is connected to an associated impedance transforming element 41 to 48 which in this example is constituted by a transmission line of wavelength $\lambda/4$. The output of the first impedance transforming element 41 is connected to the output of the second impedance transforming element 42 via a first linking element 61. Similarly the output of the second impedance transforming element 42 is also connected to the output of a third impedance transforming element 43 via a second linking element 62, and so on. Each of the linking elements 61 to 67 is, in this example, constituted by a transmission line having a wavelength of $\lambda/4$.

Each of the impedance transforming element 41 to 48 is also associated with a switch 71 to 78 which can operate to short the input of the impedance transforming element to ground.

Node 51 represents an output node which is connected to an input of a band pass filter 80.

In use, should any of the amplifiers fail or need replacing, the switches associated with that amplifier are operated to remove the amplifier from the circuit. Thus, for example, if amplifier P5 fails, then switch 35 is operated to connect the output of the delay element 25 to the associated matched load, and switch 75 is operated to short the input of the ¼ wavelength transmission line 45 to ground. The impedance transforming property of the transmission line means that, at the operating frequency $F_0$, the short circuit to ground at its input is transformed into an open circuit (high impedance) at node 55. Thus the outputs of the other amplifiers do not see a leakage path to ground via the impedance converter 45. Consequently if an amplifier is removed from operation then the power loss from the output is approximately equivalent to only the amount of power that the amplifier provides. Further power loss does not occur as in the prior art.

When each amplifier is working, its output is summed with the outputs of the other amplifiers.

Due to the topology of the circuit, the signals at the output of amplifier P1 only have a short path to the output, whereas the signals at the output of the amplifier P8 have a much longer path as these must travel through more ¼ wavelength transmission lines. It is therefore necessary to compensate the phases of the signals supplied to the input of the amplifier. The variable length delay lines 21 to 28 provide this compensation such that the delay paths in the splitter match the delay paths in the combiner.

It will be appreciated that the layout of the combiner needs to be carefully controlled in order to ensure that losses or reflections are kept to a minimum.

In the above description, it has been assumed that each of the amplifiers contributes equally. However this need not be the case and the amplifiers may, for example, be binary weighted such that the output of the second amplifier P2 is twice that of the first, the output of the third amplifier P3 is twice that of the second and so on.

The implementation of the switches has not been described in detail, but these could be fabricated from any suitable switching technique, such as PIN diodes, FET series switches or coaxial relays. The loss in these switches is relatively unimportant since they are only present in the low power part of the system. It will be appreciated that the number of paths or channels may be increased or decreased, and that the output node may also be moved to a different point in the circuit. The switches may be automatically activated by a monitoring device (not shown) which monitors the performance of each one of the amplifiers in order to determine that it is working correctly.

What is claimed is:

1. A signal combiner having a plurality of signal input paths, wherein each signal path comprises an input impedance transformer and a switch configured to selectively connect the input of the transformer to a predetermined impedance, the outputs of the impedance transformers being connected in a summing configuration and the impedance transformers being arranged in a ladder arrangement, wherein:

the signal combiner has a nominal operating frequency having a wavelength $\lambda$;

each signal transformer is formed by a transmission line having a length of $\lambda(2k+1)/4$, where k is a positive integer, including zero; and there are N input channels and N impedance transformers, each connecting to an nth node, where n is an integer in the range 1 to N and the nth node is connected to the (n−1)th node by an (n−1)th linking arrangement.

2. The signal combiner of claim 1, wherein the switch associated with an input of an impedance transformer is arranged to connect the input to ground.

3. The signal combiner of claim 1, wherein each linking arrangement is a quarter wavelength transmission line.

4. An electronic device comprising a splitter, a plurality of signal processing devices receiving input signals from the splitter, and a combiner configure to combine the outputs of the signal processing devices, wherein:

the combiner has a plurality of signal input paths; and each signal path comprises an input impedance transformer and a switch configured to selectively connect the input of the transformer to a predetermined impedance, the outputs of the impedance transformers being connected in a summing configuration and the impedance transformers being arranged in a ladder arrangement, wherein:

the splitter has an input and a plurality of outputs, and the signal at the input is divided equally between the outputs; and the nth output of the splitter, where n is a positive non zero integer, is associated with a delay element, wherein the delay expressed in terms of wavelength is $(n\lambda)/4$.

5. The electronic device of claim 4, wherein each output of the splitter is selectively connected to either an associated signal processing device or a matched load.

6. A combined splitter and phase compensation vice for use with a combiner, wherein the combined splitter and phase compensation device has N output channels, and the phase difference between an nth channel and an (n−1)th channel is $\lambda/4$ where n is an integer in the range 1 to N and wherein the combiner is of a type having a plurality of signal input paths, wherein each signal path comprises an input impedance transformer and a switch configured to selectively connect the input of the transformer to a predetermined impedance, the outputs of the impedance transformers being connected in a summing configuration and the impedance transformers being arranged in a ladder arrangement.

7. An apparatus, comprising N signal paths, wherein:

the input of an nth signal path is adapted to receive an nth input signal, where n is an integer in the range 1 to N, and N is an integer greater than 1;

each signal path comprises a series combination of one or more elements that introduce signal delay and an active component, wherein total signal delay from the signal path input to the signal path output is different for at least two of the signal paths; and for each n>1, the output of the nth signal path is connected to the output of the (n−1)th signal path by an (n−1)th linking element, wherein the total signal delay from the input of each signal path to the output of the Mth signal path is substantially equal for all N signal paths, where M is integer in the range 1 to N.

8. The invention of claim 7, wherein:

the active component is an amplifier;

the total signal delay from the signal path input to the signal path output is different for each different signal path; and M is equal to N.

9. The invention of claim 7, wherein the nth signal path comprises:

an nth delay element connected to receive the nth input signal;

for n=1, an nth impedance transforming element connected at its output to the input of the nth linking element; and for each n>1, an nth impedance transforming element connected at its output to the output of the (n−1)th linking element; and an nth active component connected at its output to the input of the nth impedance transforming element.

10. The invention of claim 9, wherein:

all N delay elements are adapted to introduce different signal delays; and all N impedance transforming elements are adapted to introduce a substantially identical signal delay.

11. The invention of claim 10, wherein:

the nth delay element is adapted to introduce a signal delay of about $(n\lambda)/4$, when expressed in terms of wavelength $\lambda$;

each impedance transforming element is adapted to introduce a signal delay o about $\lambda/4$; and each linking element is adapted to introduce a signal delay of about $\lambda/4$.

12. The invention of claim 9, wherein each signal path further comprises a switch adapted to selectively couple the input of the corresponding impedance transforming element to ground.

13. The invention of claim 9, wherein each signal path further comprises a switch adapted to selectively couple the output of the corresponding delay element to a matched load instead of to the corresponding active component.

14. The invention of claim 13, wherein each signal path further comprises another switch adapted to selectively couple the input of the corresponding impedance transforming element to ground.

15. The invention of claim 7, further comprising a splitter adapted to provide the N input signals to the N signal paths.

16. The invention of claim 15, wherein the signal paths are interconnected only through the splitter and the linking elements.

17. The invention of claim 15, wherein the N input signals are substantially identical.

* * * * *

UNITED STATES PATENT AND TRADEMARK OFFICE
CERTIFICATE OF CORRECTION

PATENT NO. : 6,844,793 B2  
DATED : January 18, 2005  
INVENTOR(S) : Peter Kenington It is certified that error appears in the above-identified patent and that said Letters Patent is hereby corrected as shown below:

<u>Column 5,</u>
Line 48, replace "vice" with -- device --.

Signed and Sealed this

Seventeenth Day of May, 2005

JON W. DUDAS  
*Director of the United States Patent and Trademark Office*